A semiconductor device with openings of differing depths in a substrate or layer is described, as are related methods for its manufacture. Through selective deposition of a single mask layer, whereby low aspect ratio openings are substantially coated while high aspect ratio are at most partially coated, subsequent etching of the substrate or layer is restricted to uncoated portions of the high aspect ratio openings. The result is a substrate or layer with openings of more than one depth using a single mask layer. In a second embodiment, the selective deposition of a single mask layer is utilized to etch a layer while protecting underlying structures from etching. In a third embodiment, the selective deposition of a single mask layer is utilized to etch an opening into a layer wherein the opening has a sub-lithographic diameter, i.e., the diameter of the opening is smaller than can be achieved with the particular lithographic technique employed.

(12) United States Patent
Dobuzinsky et al.

(10) Patent No.: US 6,887,785 B1
(45) Date of Patent: May 3, 2005

(54) ETCHING OPENINGS OF DIFFERENT DEPTHS USING A SINGLE MASK LAYER METHOD AND STRUCTURE

(75) Inventors: David M. Dobuzinsky, New Windsor, NY (US); Carl J. Radens, LaGrangeville, NY (US); Roy C. Iggulden, Newburgh, NY (US); Jay W. Strane, Chester, NY (US); Keith K. H. Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/709,564

(22) Filed: May 13, 2004

(51) Int. Cl.[7] .......................................... H01L 21/4763
(52) U.S. Cl. ........................ 438/638; 438/700; 438/622; 438/629; 438/696; 438/735; 257/E23.149
(58) Field of Search ................................ 438/622, 629, 438/638, 700, 696, 735; 257/E23.145

(56) References Cited

U.S. PATENT DOCUMENTS

| | | | |
|---|---|---|---|
| 5,422,309 A | | 6/1995 | Zettler et al. |
| 5,562,801 A | * | 10/1996 | Nulty .......................... 438/695 |
| 5,865,938 A | * | 2/1999 | Peeters et al. .......... 156/345.51 |
| 6,008,540 A | | 12/1999 | Lu et al. |
| 6,025,276 A | | 2/2000 | Donohoe et al. |
| 6,100,177 A | * | 8/2000 | Noguchi ...................... 438/620 |
| 6,110,648 A | | 8/2000 | Jang |
| 6,124,216 A | | 9/2000 | Ko et al. |
| 6,124,421 A | | 9/2000 | Lau et al. |
| 6,180,489 B1 | | 1/2001 | Yang et al. |
| 6,211,035 B1 | | 4/2001 | Moise et al. |
| 6,214,423 B1 | | 4/2001 | Lee et al. |
| 6,221,780 B1 | | 4/2001 | Greco et al. |
| 6,251,791 B1 | * | 6/2001 | Tsai et al. .................... 438/700 |
| 6,255,211 B1 | | 7/2001 | Olsen et al. |
| 6,265,303 B1 | | 7/2001 | Lu et al. |
| 6,303,447 B1 | | 10/2001 | Chhagan et al. |
| 6,303,733 B1 | | 10/2001 | Lau et al. |
| 6,339,002 B1 | | 1/2002 | Chan et al. |
| 6,348,374 B1 | | 2/2002 | Athavale et al. |
| 6,351,039 B1 | | 2/2002 | Jin et al. |
| 6,361,837 B2 | | 3/2002 | Pangrie et al. |
| 6,387,765 B2 | | 5/2002 | Chhagan et al. |
| 6,406,963 B2 | | 6/2002 | Woerlee et al. |
| 6,426,558 B1 | | 7/2002 | Chapple-Sokol et al. |
| 6,430,028 B1 | | 8/2002 | Kar-Roy et al. |
| 6,444,542 B2 | | 9/2002 | Moise et al. |
| 6,472,312 B2 | | 10/2002 | Bao et al. |
| 6,541,349 B2 | | 4/2003 | Arthanari et al. |
| 6,566,276 B2 | | 5/2003 | Maloney et al. |
| 6,617,224 B2 | | 9/2003 | Yu et al. |
| 6,667,223 B2 | | 12/2003 | Seitz |
| 6,709,978 B2 | | 3/2004 | Geusic et al. |
| 6,710,447 B1 | | 3/2004 | Nogami |

* cited by examiner

Primary Examiner—George Fourson
Assistant Examiner—Thanh V Pham
(74) Attorney, Agent, or Firm—James J. Cioffi; Hoffman, Warnick & D'Alessandro LLC

(57) ABSTRACT

17 Claims, 11 Drawing Sheets

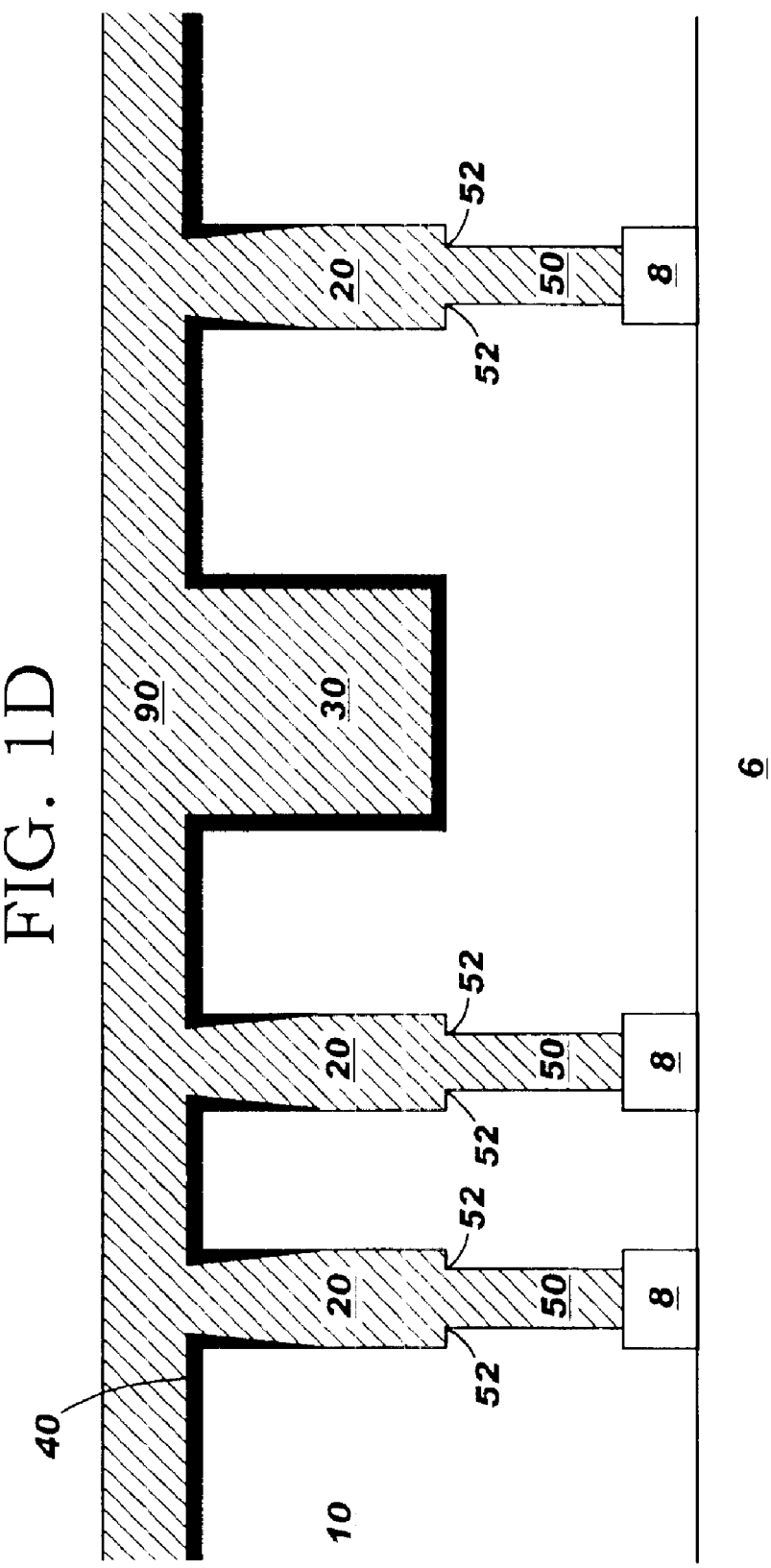

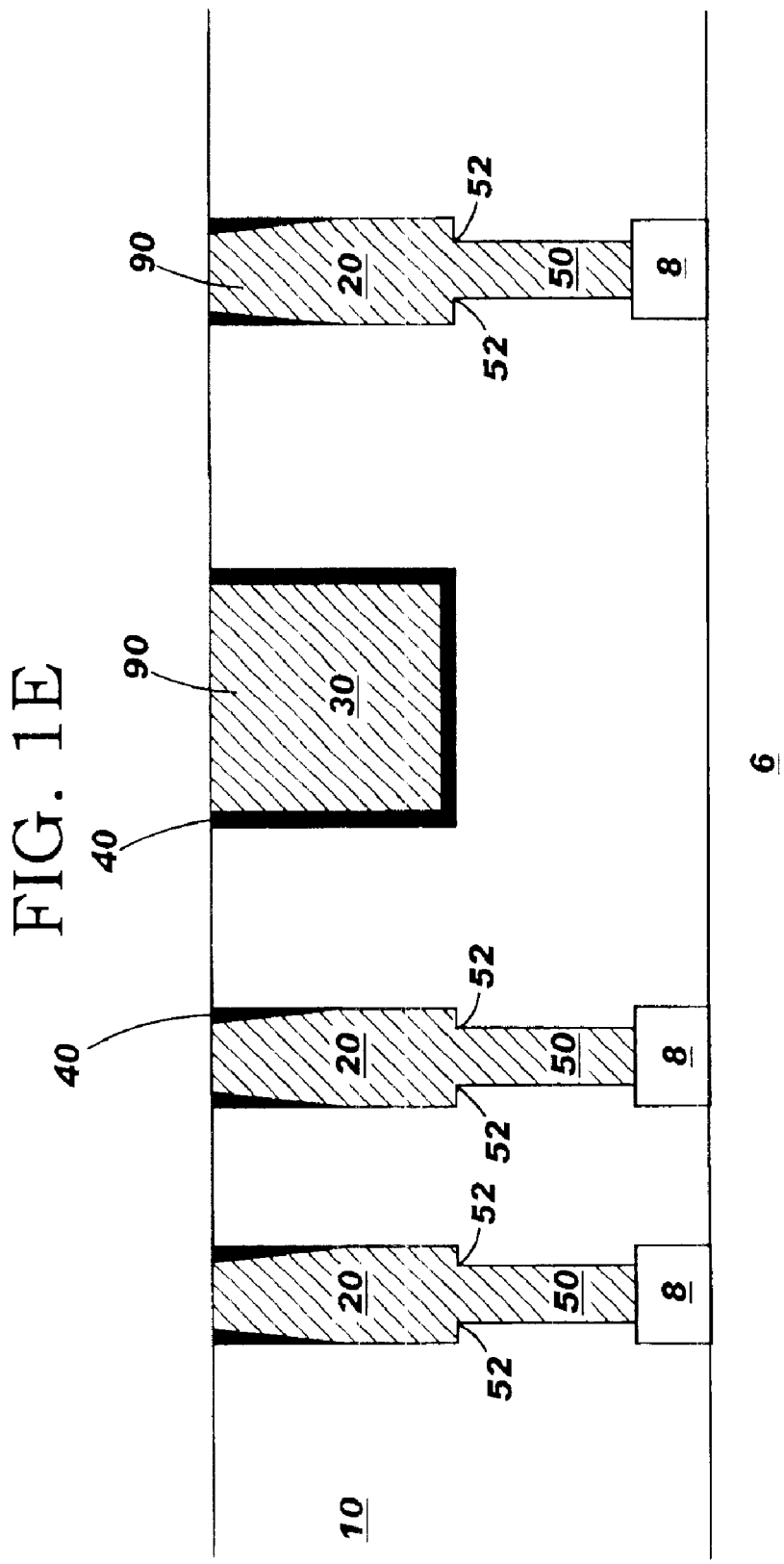

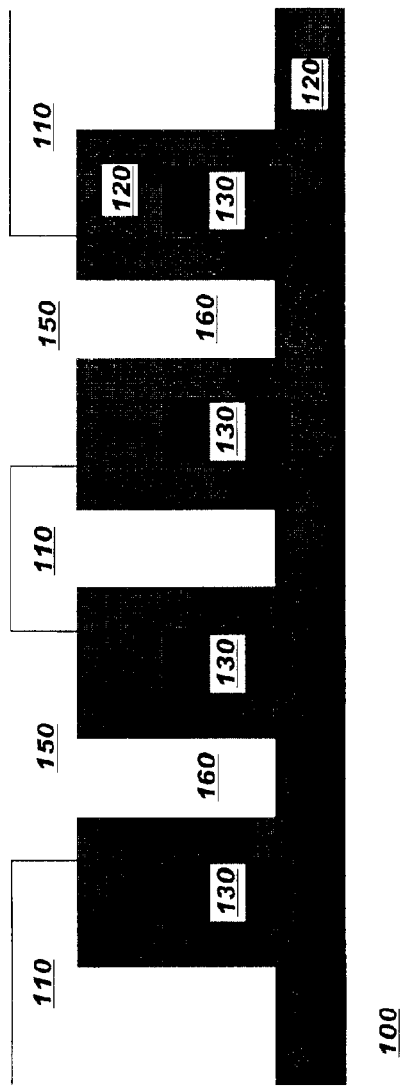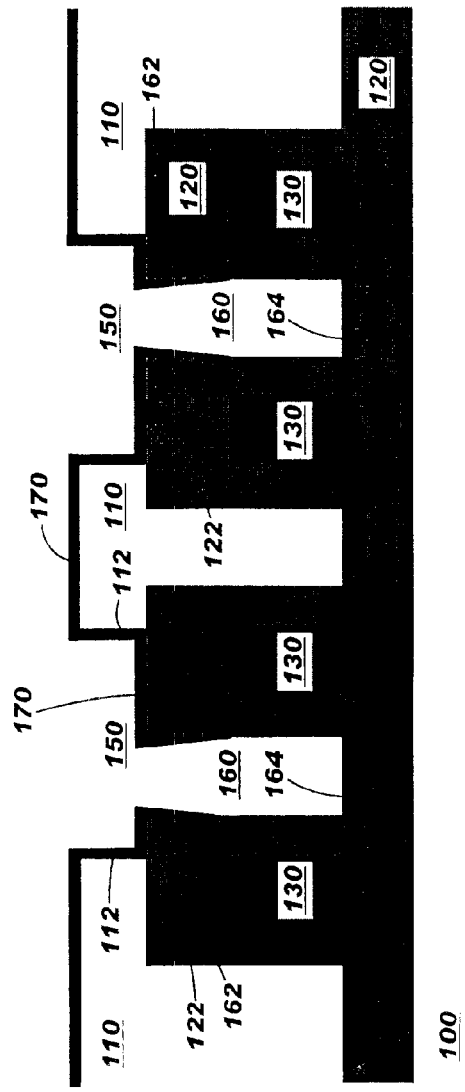

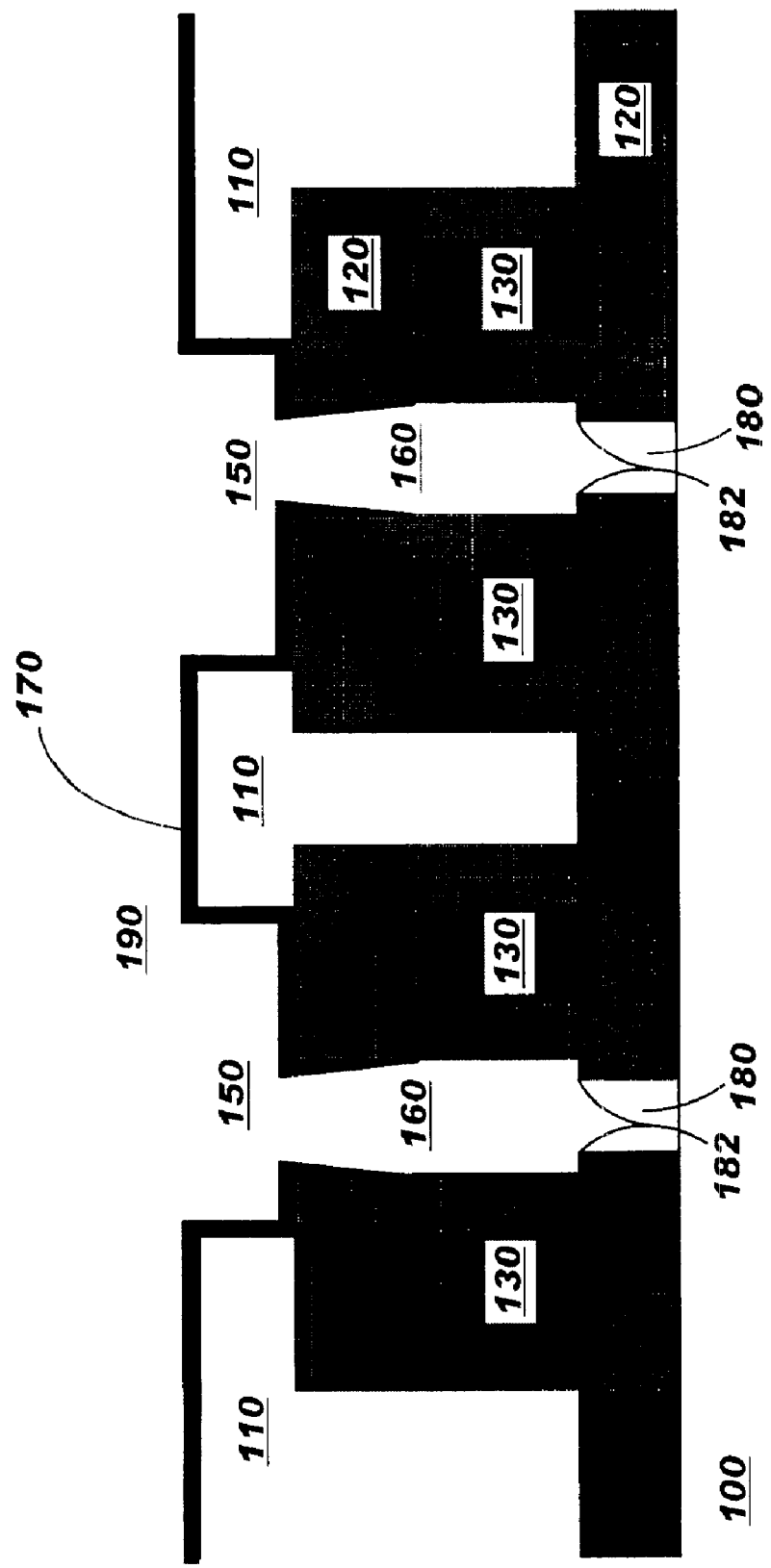

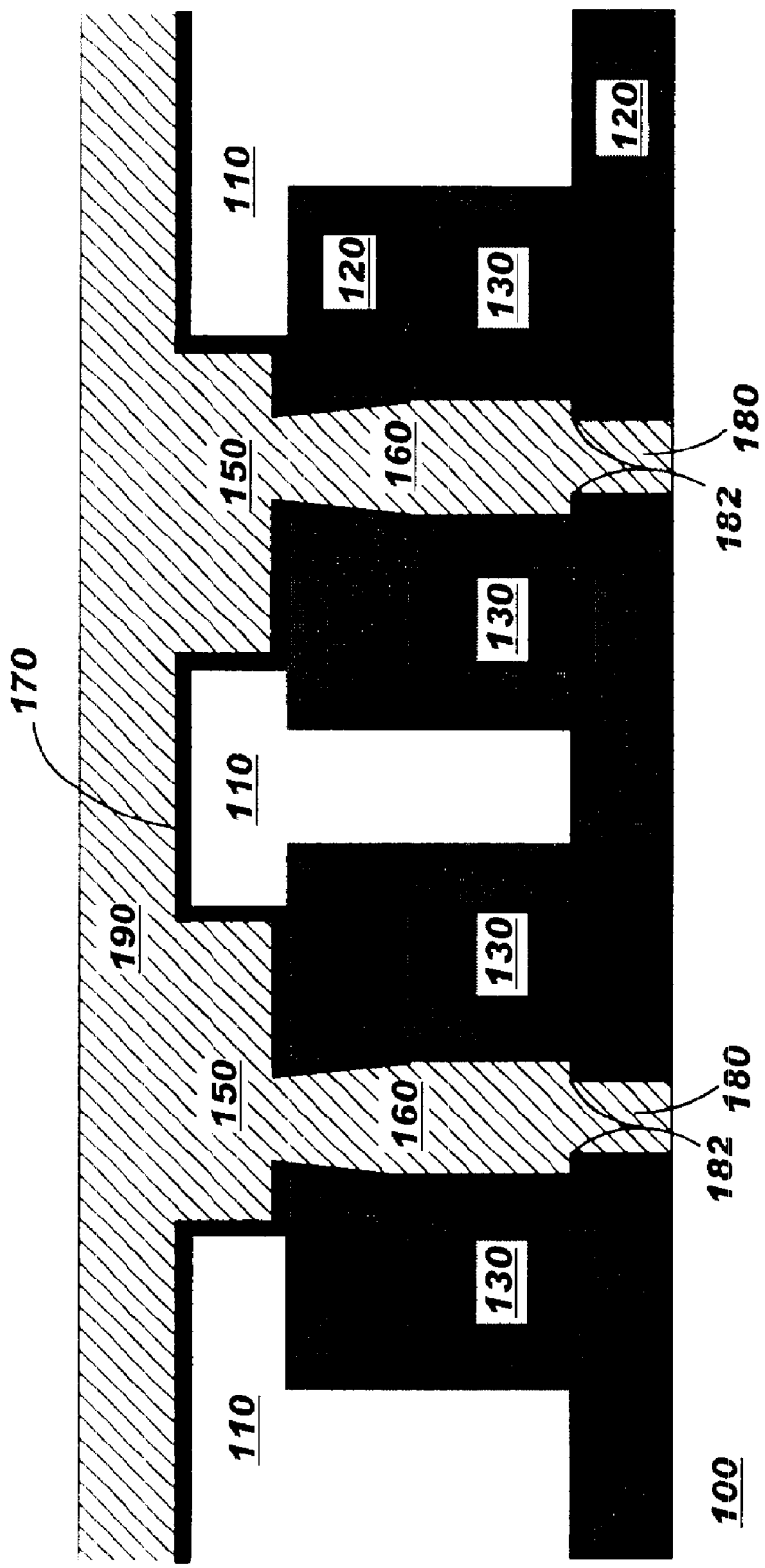

ETCHING OPENINGS OF DIFFERENT DEPTHS USING A SINGLE MASK LAYER METHOD AND STRUCTURE

BACKGROUND OF INVENTION

1. Technical Field

The claimed invention relates generally to semiconductor products and more specifically to the selective etching of high aspect ratio openings using a single mask layer.

2. Description of Related Art

In the manufacture of semiconductor devices, individual components must be interconnected to perform functions. Generally, this is accomplished by the introduction of conductive materials into openings in the silicon substrate between the individual components.

A common process by which such interconnections are made is the damascene technique, whereby openings are selectively etched into a dielectric layer covering the individual components. Generally, a photoresist material is layered onto the dielectric layer and a pattern of openings outlined in the photoresist layer using lithographic techniques. An anisotropic etch is then used to form the openings in the dielectric layer. The photoresist material is then removed. Where openings are to connect individual components on more than one level, it is necessary to selectively cover some openings with an etch-resistant mask layer, etch the dielectric layer, and remove the mask layer. Generally, such a process requires the use of more than one mask layer with varying resistances to the anisotripic etch processes. Finally, the openings are filled with a conductive material, completing the connections between the individual components.

As the size of semiconductor devices has decreased, the width of the openings connecting them has necessarily decreased. As a result, it has become more difficult to fill high aspect ratio openings with the conductive material. There have been several inventions directed toward solving this problem. See, e.g., U.S. Pat. No. 6,710,447 to Nogami.

What has not been previously described, however, is the utilization of the high aspect ratio problem in selectively etching openings of varying depths in a dielectric layer, thereby eliminating the need for multiple mask layers.

SUMMARY OF INVENTION

A semiconductor device with openings of differing depths in a substrate or layer is described, as are related methods for its manufacture. Through selective deposition of a single mask layer, whereby low aspect ratio openings are substantially coated while high aspect ratio openings are at most partially coated, subsequent etching of the layer is restricted to uncoated portions of the high aspect ratio openings. The result is a layer with openings of more than one depth using a single mask layer. In a second embodiment, the selective deposition of a single mask layer is utilized to etch a layer while protecting underlying structures from etching. In a third embodiment, the selective deposition of a single mask layer is utilized to etch an opening into a layer wherein the opening has a sub-lithographic diameter, i.e., the diameter of the opening is smaller than can be achieved with the particular lithographic technique employed.

A first aspect of the invention is directed toward a semiconductor device comprising a substrate, a device over the substrate, a dielectric layer over the substrate and the device, the dielectric layer including at least one high aspect ratio opening and at least one low aspect ratio opening, a rim within the high aspect ratio opening, the rim being at the depth of the low aspect ratio opening, a diameter of the high aspect ratio opening being smaller below the rim than above the rim, and a coating material over the openings into the dielectric layer.

A second aspect of the invention is directed toward a method of manufacturing a semiconductor device with openings of differing depths in a dielectric layer. The method comprises the steps of depositing a dielectric layer onto a layer having a plurality of devices; forming a plurality of openings into the dielectric layer, the plurality including at least one high aspect ratio opening and at least one low aspect ratio opening; depositing an etch-resistant mask layer onto the dielectric layer such that the etch-resistant mask layer substantially coats at least one low aspect ratio opening and at most partially coats at least one high aspect ratio opening; etching only the high aspect ratio opening; depositing a coating material into the plurality of openings.

A third aspect of the invention is directed toward a method of protecting underlying structures during the manufacture of a semiconductor device. The method comprises the steps of depositing an interlevel dielectric layer onto an encapsulating dielectric layer having a plurality of structures and residing atop a substrate, where the interlevel dielectric includes a material different from the material of the encapsulating dielectric; forming at least one high aspect ratio opening by removing the interlevel dielectric layer from between the plurality of structures without removing the encapsulating dielectric layer; depositing an etch-resistant mask layer onto the interlevel dielectric layer and exposed portions of the encapsulating dielectric layer such that the etch-resistant mask layer at most partially coats the high aspect ratio opening and substantially coats the remaining surfaces of the interlevel dielectric layer and the encapsulating dielectric layer; etching the encapsulating dielectric layer such that the high aspect ratio opening is etched through to the substrate; depositing a coating material into the high aspect ratio opening such that a connection is made to the substrate.

The above and additional advantages of the present invention will become apparent to those skilled in the art from the following detailed description and accompanying drawings.

BRIEF DESCRIPTION OF DRAWINGS

The embodiments of this invention will be described in detail, with reference to the following figures, wherein:

FIGS. 1A to 1E show schematic cross-sectional views of a method for the manufacture of a semiconductor device according to a first embodiment of the invention.

FIGS. 2A to 2E show schematic cross-sectional views of a method for protecting underlying structures while etching a dielectric layer according to a second embodiment of the invention.

DETAILED DESCRIPTION

In general, the device and methods of the claimed invention employ terminologies common to the manufacture of semiconductor devices. For example, an opening, as used in the following description and claims, may be a channel, via, hole, socket, valley, furrow, trough, duct, trench, or any other similar structure.

Figure 1A:
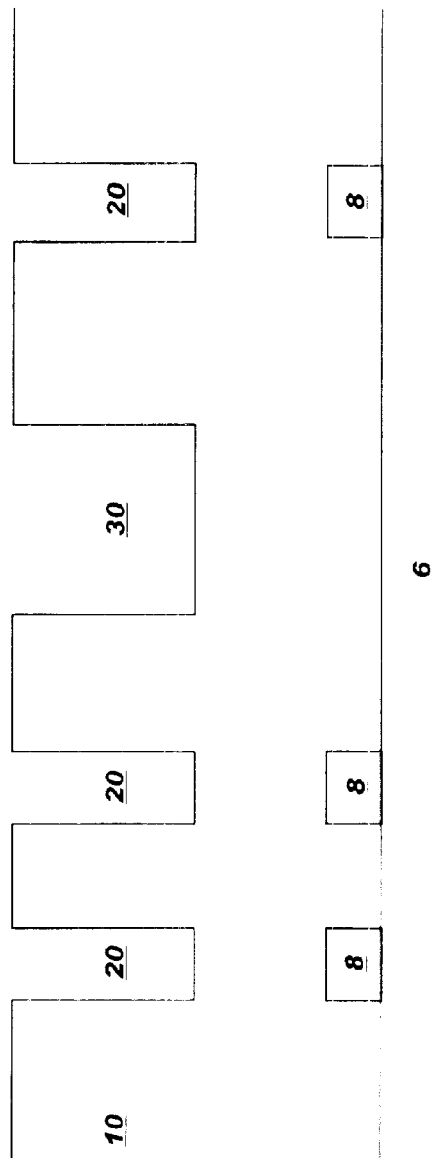

Referring to FIG. 1A, a dielectric layer 10 has been deposited atop a substrate 6 and device 8 and has been etched to produce high aspect ratio openings 20 and low aspect ratio openings 30. Dielectric layer 10 can be of any material common to the manufacture of semiconductor devices, such as, e.g., silicon oxide, silicon dioxide, hydrogenated silicon oxycarbide, etc. High aspect ratio openings 20 in dielectric layer 10 preferably have diameters less than about one-half their depths, and more preferably about less than one-quarter their depths. Low aspect ratio openings 30 in dielectric layer 10 preferably have diameters greater than about one-half their depths, and more preferably have diameters greater than their depths.

Figure 1B:
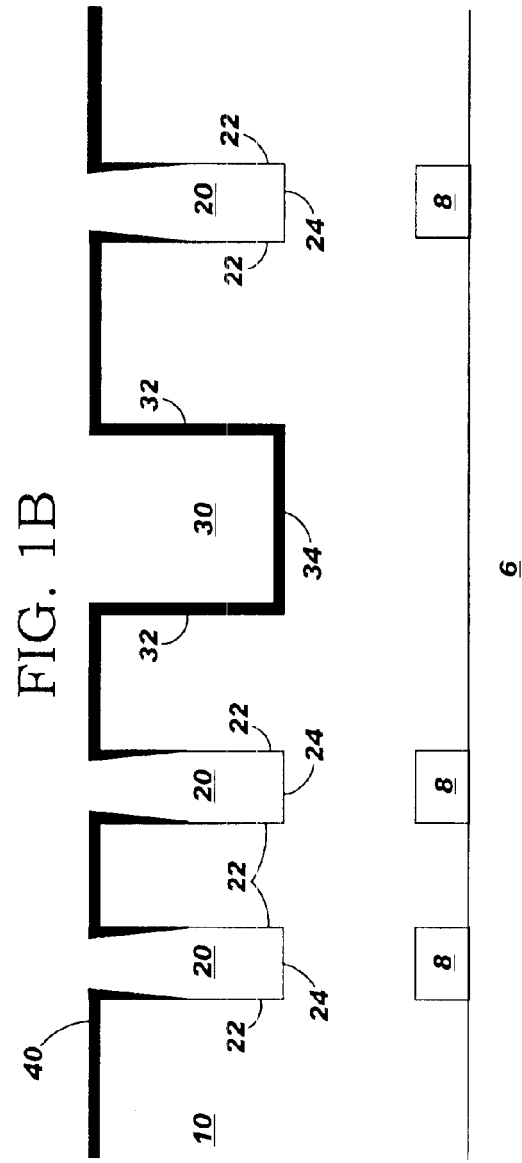

Referring to FIG. 1B, an etch-resistant mask layer 40 has been deposited onto the dielectric layer 10. Etch-resistant mask layer 40 substantially coats the surface of the dielectric layer 10 and the walls 32 and bottoms 34 of low aspect ratio openings 30 in dielectric layer 10. Deposition of etch-resistant mask layer 40 into high aspect ratio openings 20 is partial, and generally limited to the upper portions of the walls 22. Preferably, no deposition of the etch-resistant mask layer is made onto the bottoms 24 of high aspect ratio openings 20, as such deposition may preclude selective etching of high aspect ratio openings 20. Etch-resistant mask layer 40 can be of any type common to the manufacture of semiconductor devices, such as, e.g., Si, W, $Si_3_34$, $SiO2$, etc., provided it is less susceptible to etching than dielectric layer 10. Deposition of etch-resistant mask layer 40 can be by any means common to the manufacture of semiconductor devices, such as, e.g., physical vapor deposition (PVD), chemical vapor deposition (CVD), sputter deposition, etc.

Figure 1C:
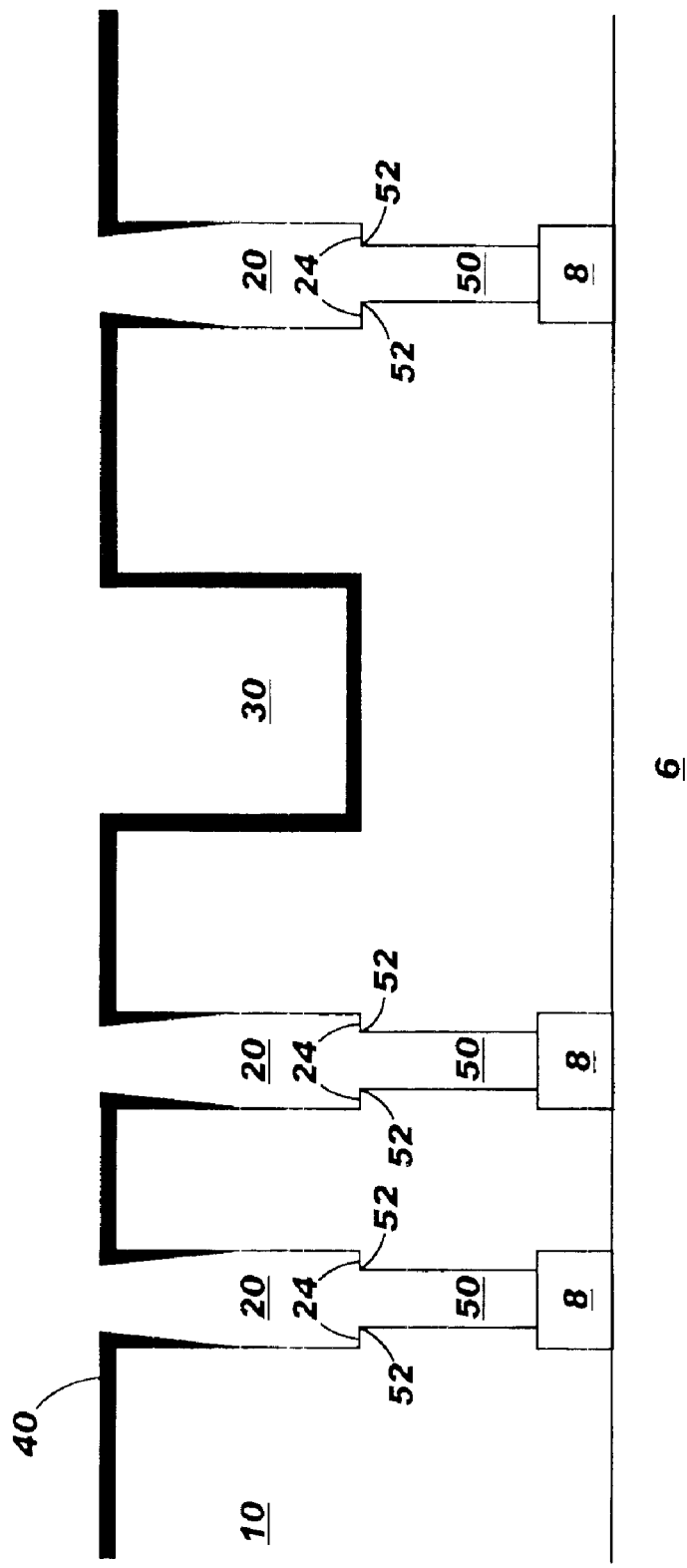

Referring to FIG. 1C, application of an etch recipe selective to etch-resistant mask layer 40, but capable of etching dielectric layer 10, results in additional etching of the bottoms 24 of high aspect ratio openings 20 and the formation of second level high aspect ratio openings 50. The junction between a high aspect ratio opening 20 and a second level high aspect ratio opening 50 is distinguished by a rim 52, residing at the depth of the high aspect ratio opening 20 and resulting from the incomplete etching of the bottom 24 of high aspect ratio opening 20. In the situation where high aspect ratio opening 20 and second level high aspect ratio opening 50 are in the form of a channel, the resulting rims 52 are distinct members residing on either side of the channel. In the situation where high aspect ratio opening 20 and second level high aspect ratio opening 50 are in the form of a via, the resulting rim 52 is a single circumferential member residing between the high aspect ratio opening 20 and the second level high aspect ratio opening 50.

Referring to FIG. 1D, a coating material 90 has been overlaid onto dielectric layer 10 and into low aspect ratio openings 30, high aspect ratio openings 20, and second level high aspect ratio openings 50. Coating material 90 can be of any material common to the manufacture of semiconductor devices. Where coating material 90 is to serve as a conductor, coating material 90 may be, e.g., copper, aluminum, tungsten, silicon, titanium nitride, etc. Alternatively, where coating material 90 is used to reduce resistance-capacitance losses, coating material may be a low K dielectric material. Coating material 90 may be deposited by any means common to the manufacture of semiconductor devices and capable of filling high aspect ratio openings, such as, e.g., CVD, etc.

Referring to FIG. 1E, in keeping with finishing steps common to the manufacture of semiconductor devices, the surface of the semiconductor device has been etched back or polished to remove any coating material 90 and etch-resistant mask layer 40 deposited on the surface of dielectric layer 10. The polishing means can be any means common to the manufacture of semiconductor devices, such as, e.g., chemical-mechanical polishing (CMP), etc., while the etch back means includes, for example, wet or Reactive Ion Etching (RIE) techniques.

In accordance with a second embodiment of the invention, dielectric layers may be selectively etched while protecting underlying structures. Referring to FIG. 2A, a semiconductor device has been prepared, having an interlevel dielectric layer 110 deposited onto an encapsulating dielectric layer 120, which contains a plurality of underlying structures 130. Interlevel dielectric layer 110 has been etched to reveal high aspect ratio openings 160 between underlying structures 130 within encapsulating dielectric layer 120.

Underlying structures 130 may include channels containing conductive materials, such as silicon, tungsten, silicides, titanium nitride, copper, aluminum, etc. Interlevel dielectric layer 110 and encapsulating dielectric layer 120 may be of types common to the manufacture of semiconductor devices, but must be used in combinations such that interlevel dielectric layer 110 is capable of being etched by an etching recipe which is incapable or only slightly capable of etching encapsulating dielectric layer 120.

Referring to FIG. 2B, an etch-resistant mask layer 170 has been deposited onto the exposed surfaces of interlevel dielectric layer 110 and the top surface 122 of encapsulating dielectric layer 120. Together, the vertical surfaces 112 of the interlevel dielectric layer 110 and top surfaces 122 of encapsulating dielectric layer 120 form low aspect ratio openings 150 similar to those in the first embodiment of the invention. Etch-resistant mask layer 170 substantially fills these low aspect ratio openings 150. Deposition of etch-resistant mask layer 170 into high aspect ratio openings 160 between underlying structures 130 within encapsulating dielectric layer 120 is at most partial, and generally limited to the upper portions of the walls 162, as depicted in FIG. 2B. Preferably, no deposition of etch-resistant mask layer 170 is made onto the bottoms 164 of high aspect ratio openings 160.

Referring to FIG. 2C, application of an etch recipe selective to etch-resistant mask layer 170, but capable of etching encapsulating dielectric layer 120, results in additional etching of the bottom 164 of high aspect ratio openings 160 and the formation of second level high aspect ratio openings 180. As depicted in FIG. 2C, second level high aspect ratio opening 180 has been etched through to substrate 100.

The junction between a high aspect ratio opening 160 and a second level high aspect ratio opening 180 is distinguished by a rim 182, residing at the initial depth of high aspect ratio opening 160 and resulting from the incomplete etching of the bottom 164 of high aspect ratio opening 160. In the situation where high aspect ratio opening 160 and second level high aspect ratio opening 180 are in the form of a channel, the resulting rims 182 are distinct members residing on each side of the channel. In the situation where high aspect ratio opening 160 and second level high aspect ratio opening 180 are in the form of a via, the resulting rim 182 is a single circumferential member residing between high aspect ratio opening 160 and second level high aspect ratio opening 180. The etch recipe used can be of any anisotropic type common to the manufacture of semiconductor devices, such as, e.g., RIE, etc.

Referring to FIG. 2D, a coating material 190 has been deposited over etch-resistant mask layer 170 and into high aspect ratio opening 160 and second level high aspect ratio opening 180. Conductive material 190 may be one or more of any commonly used in the manufacture of semiconductor devices. Where coating material 190 is to serve as a conductor, coating material 190 may be, e.g., copper, aluminum, tungsten, silicon, titanium nitride, etc. Alternatively, where coating material 190 is used to reduce resistance-capacitance losses, coating material may be a low K dielectric material. Coating material 190 may be deposited by any means common to the manufacture of semiconductor devices and capable of filling high aspect ratio openings, such as, e.g., CVD, etc.

Figure 2E:
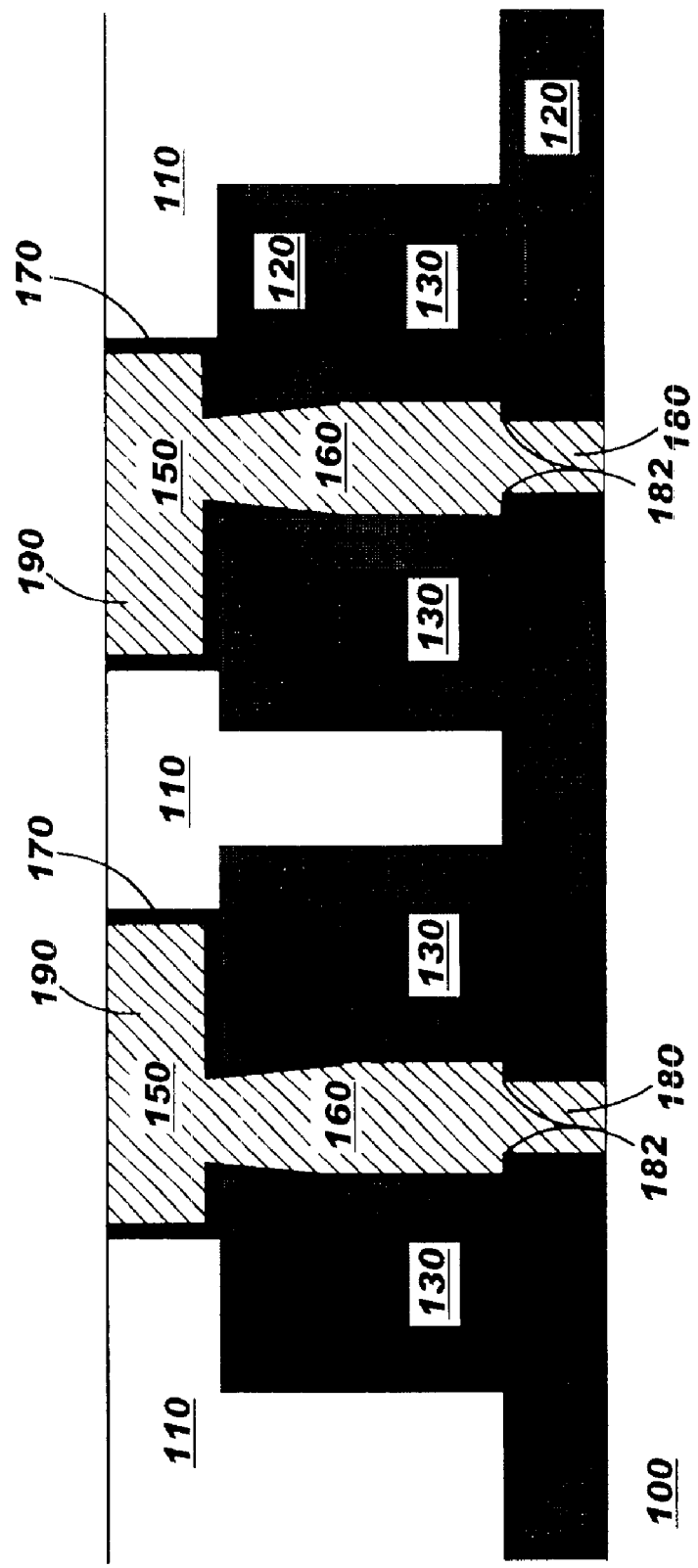

Referring to FIG. 2E, in keeping with finishing steps common to the manufacture of semiconductor devices, the surface of the semiconductor device has been processed to remove any coating material 190 and etch-resistant mask layer 170 deposited on the surface of dielectric layer 110. This processing could be achieved by polishing, e.g., by CMP, or by a controlled etch back procedure using a chemical etch, e.g., RIE or wet etches, for each of the materials.

In a preferred embodiment of the claimed invention, it is possible to produce an opening into a dielectric layer wherein the opening has a sub-lithographic diameter. That is, the diameter of the opening is smaller than the smallest diameter opening achievable using current lithographic techniques. For example, the smallest diameter opening currently achievable with ArF 193 nm lithography is about 80 nm for an isolated feature (subject to variability, of course, depending upon the pattern density and shape complexity).

Figure 3A:
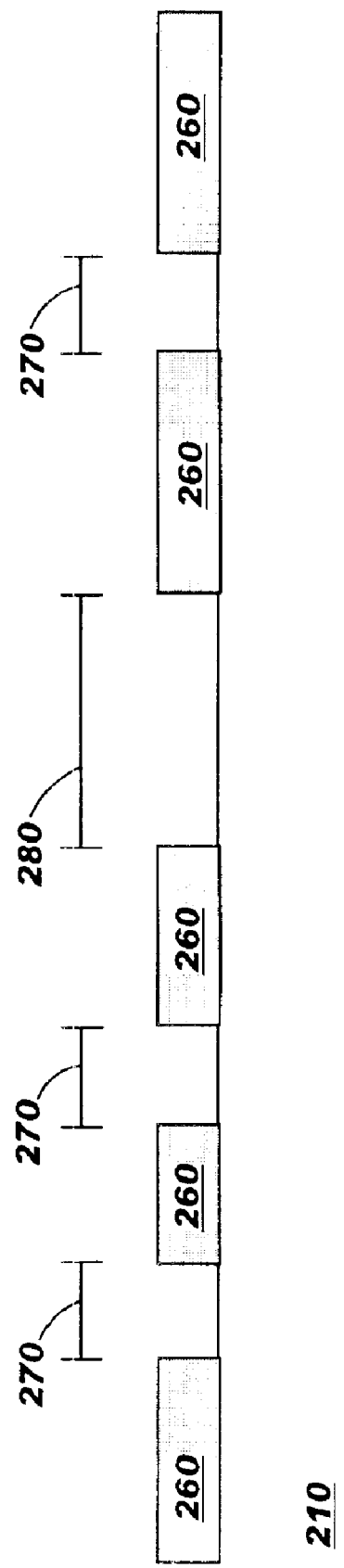
FIGS. 3A to 3D show schematic cross-sectional views of a method for the formation of an opening in a dielectric layer where the opening has a sub-lithographic diameter.

Referring to FIG. 3A, a photoresist layer 260 has been applied to a dielectric layer 210 and portions of the photoresist layer 260 removed using a lithographic technique, to include a pattern of openings to be etched in the dielectric layer. A first diameter 270 between remaining portions of photoresist layer 260 represents the smallest diameter achievable with the lithographic technique employed. A second diameter 280 between remaining portions of photoresist layer 260 represents a diameter greater than first diameter 270. The lithographic technique employed may be any of those commonly employed in the manufacture of semiconductor devices.

Figure 3B:
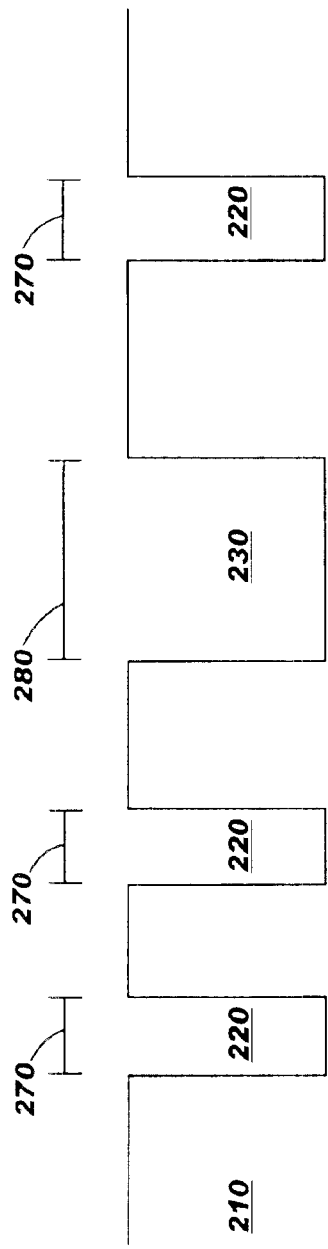

Referring to FIG. 3B, dielectric layer 210 has been etched and the photoresist layer removed to reveal a high aspect ratio opening 220 and a low aspect ratio opening 230 in dielectric layer 210. The diameter 270 of high aspect ratio opening 220 is equal to the smallest diameter achievable with the lithographic technique employed. The diameter 280 of low aspect ratio opening 280 is greater than diameter 270 of high aspect ratio opening 220.

Figure 3C:
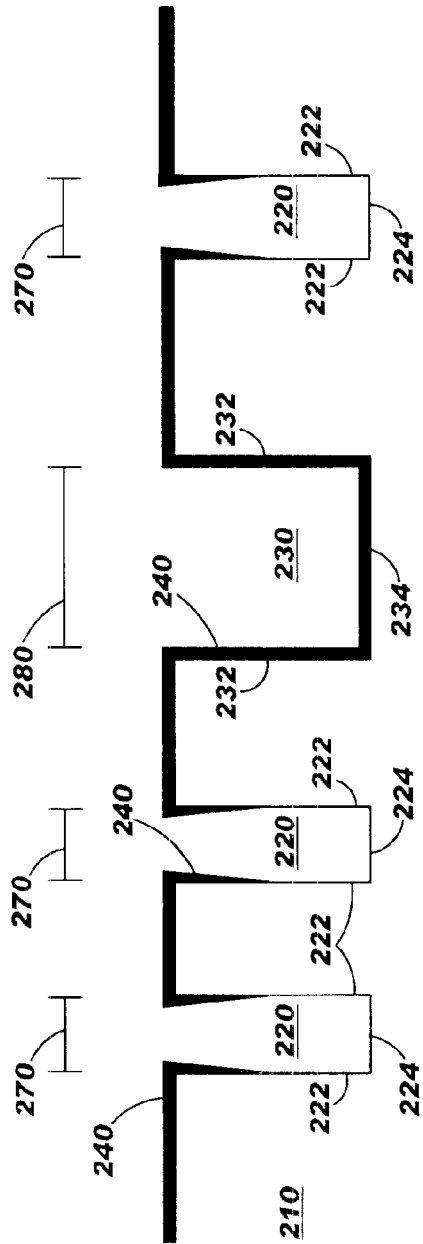

Referring to FIG. 3C, an etch-resistant mask layer 240 has been deposited onto dielectric layer 210, substantially coating the top surface of dielectric layer 210 and the bottom 234 and sidewalls 232 of low aspect ratio opening 230, and at most partially coating the sidewalls 222 of high aspect ratio opening 220. Generally, coating of high aspect ratio opening 220 is limited to the upper portions of the sidewalls 222. Preferably, no etch-resistant mask layer 240 is deposited onto the bottom 224 of high aspect ratio opening 220.

Figure 3D:
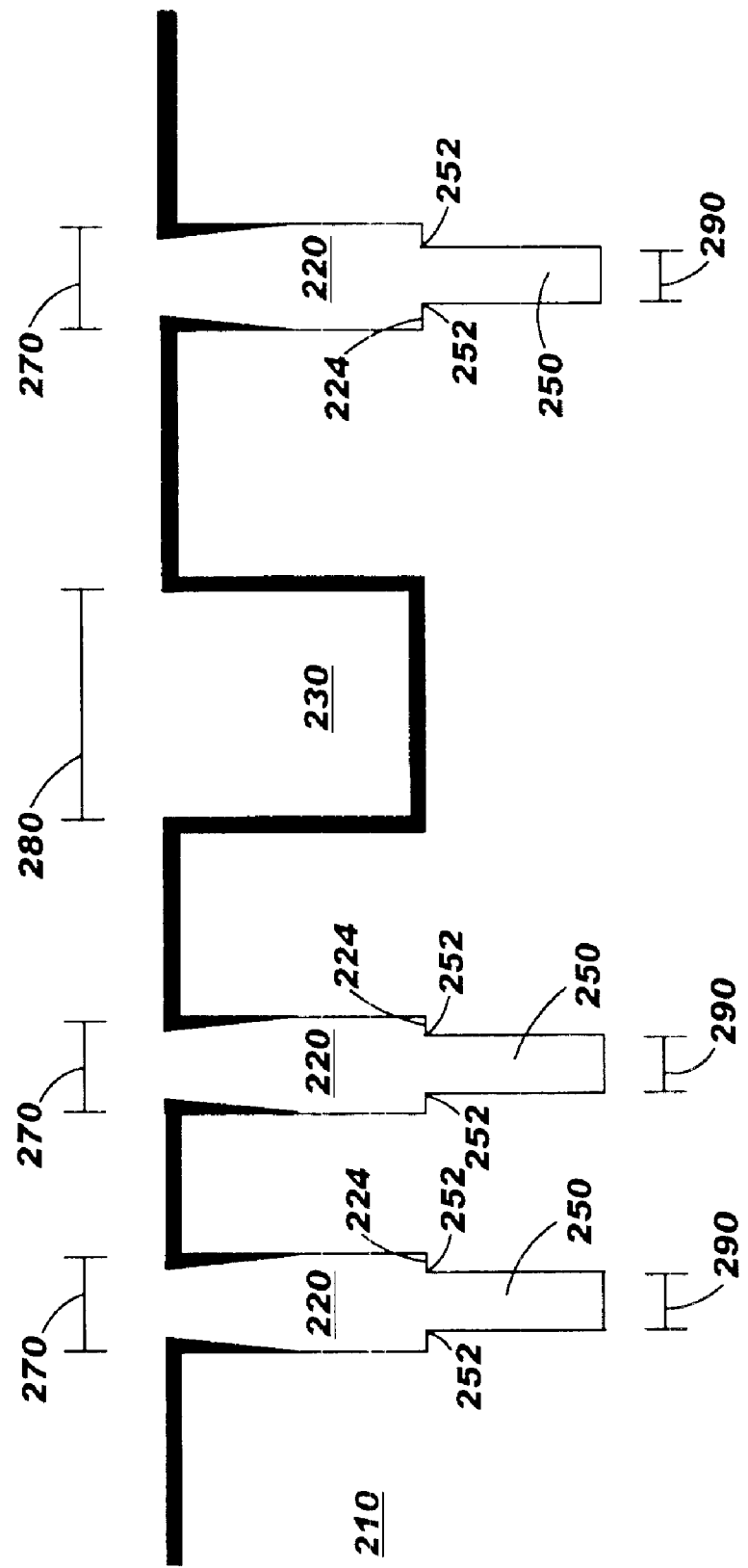

Referring to FIG. 3D, the bottom 224 of high aspect ratio opening 220 not covered by etch-resistant mask layer 240 has been further etched to produce a second level high aspect ratio opening 250. The diameter 290 of second level high aspect ratio opening 250 is smaller than diameter 270 of high aspect ratio opening 220. That is, diameter 290 of second level high aspect ratio opening 250 is smaller than the smallest diameter opening achievable with the lithographic technique employed.

While this invention has been described in conjunction with the specific embodiments outlined above, it is evident that many alternatives, modifications, and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method of manufacturing a semiconductor device with openings of differing depths in a layer, the method comprising the steps of:
   depositing a second layer onto a first layer having a plurality of devices;
   forming a plurality of openings into the second layer, the plurality of openings including at least one high aspect ratio opening and at least one low aspect ratio opening;
   depositing an etch-resistant mask layer onto the second layer such that the etch-resistant mask layer substantially coats the at least one low aspect ratio opening and at most partially coats the at least one high aspect ratio opening;
   etching only the at least one high aspect ratio opening; and
   depositing a coating material into the plurality of openings.

2. The method of claim 1, wherein the second layer is selected from a group consisting of silicon oxide, silicon dioxide, and hydrogenated silicon oxycarbide.

3. The method of claim 1, wherein the etch-resistant mask layer is selected from a group consisting of Si, $SiO_2$, $Si_3N_4$, W, and Cr.

4. The method of claim 1, wherein, before deposition of the etch resistant mask layer a) the at least one high aspect ratio opening has a diameter less than about one-half the depth of the at least one high aspect ratio opening, and b) the at least one low aspect ratio opening has a diameter greater than about one-half the depth of the at least one low aspect ratio opening.

5. The method of claim 1, wherein the etch-resistant mask layer is deposited by an anisotropic technique selected from a group consisting of physical vapor deposition (PVD), sputter deposition, and chemical vapor deposition (CVD).

6. The method of claim 1, wherein the at least one high aspect ratio opening is etched using Reactive Ion Etching (RIE).

7. The method of claim 1, further comprising the step of using an anisotropic etch, prior to etching the at least one high aspect ratio opening, to remove any etch-resistant mask layer from the bottom of the at least one high aspect ratio opening without removing the etch-resistant mask layer from the at least one low aspect ratio opening.

8. A method of protecting underlying structures during the manufacture of a semiconductor device, the method comprising the steps of:
   depositing an interlevel layer onto an encapsulating layer having a plurality of structures and residing atop a substrate, where the interlevel layer includes a material different from the material of the encapsulating layer;
   forming at least one high aspect ratio opening by removing the interlevel layer from between the plurality of structures without removing the encapsulating layer;

depositing an etch-resistant mask layer onto the interlevel layer and exposed portions of the encapsulating layer such that the etch-resistant mask layer at most partially coats the at least one high aspect ratio opening and substantially coats the remaining surfaces of the interlevel layer and the encapsulating layer;

etching the encapsulating layer such that the at least one high aspect ratio opening is etched through to the substrate; and depositing a coating material into the at least one high aspect ratio opening such that a connection is made to the substrate.

9. The method of claim 8, wherein the interlevel layer is selected from a group consisting of silicon oxide, silicon dioxide, and hydrogenated silicon oxycarbide.

10. The method of claim 8, wherein the encapsulating layer is selected from a group consisting of silicon nitride, silicon carbide, and siliconoxynitride.

11. The method of claim 8, wherein the etch-resistant mask layer is selected from a group consisting of Si, $SiO_2$, $Si_3N_4$, W, and Cr.

12. The method of claim 8, wherein the at least one high aspect ratio opening, before deposition of the etch-resistant mask layer, has a diameter less than about one-half the depth of the at least one high aspect ratio opening.

13. The method of claim 8, wherein the etch-resistant mask layer is deposited by an anisotropic technique selected from a group consisting of physical vapor deposition (PVD) and sputter deposition.

14. The method of claim 8, wherein one or more of the interlevel layer and the encapsulating layer are etched using Reactive Ion Etching (RIE).

15. The method of claim 8, further comprising the step of removing any etch-resistant mask layer from the bottom of the at least one high aspect ratio opening without removing the etch-resistant mask layer from the remaining surfaces of the interlevel layer and the encapsulating layer prior to etching the at least one high aspect ratio opening.

16. The method of claim 15, wherein the removal of any etch-resistant mask layer is by means of Reactive Ion Etching (RIE).

17. The method of claim 8, wherein the etching of the encapsulating layer through to the substrate has a diameter less than the diameter of the at least one high aspect ratio opening between the plurality of structures.

* * * * *